(12) United States Patent
Javerliac

(10) Patent No.: US 8,504,961 B2
(45) Date of Patent: Aug. 6, 2013

(54) INTEGRATED CIRCUIT WITH TIMING ADJUSTMENT MECHANISM

(75) Inventor: Virgile Javerliac, Grenoble (FR)

(73) Assignee: ARM Limited, Cambridge (GB)

( * ) Notice: Subject to any disclaimer, the term of this patent is extended or adjusted under 35 U.S.C. 154(b) by 181 days.

(21) Appl. No.: 13/067,249

(22) Filed: May 18, 2011

(65) Prior Publication Data

US 2011/0291731 A1    Dec. 1, 2011

Related U.S. Application Data

(60) Provisional application No. 61/350,138, filed on Jun. 1, 2010.

(51) Int. Cl.
*G06F 17/50* (2006.01)
(52) U.S. Cl.
USPC ............................ 716/114; 716/113; 716/134
(58) Field of Classification Search
USPC ................. 716/100, 110, 113, 114, 122, 134; 327/281
See application file for complete search history.

(56) References Cited

U.S. PATENT DOCUMENTS

| | | | | |
|---|---|---|---|---|
| 3,919,695 A | * | 11/1975 | Gooding | 713/500 |
| 4,825,287 A | * | 4/1989 | Baji et al. | 348/720 |
| 5,544,071 A | * | 8/1996 | Keren et al. | 716/108 |
| 5,870,404 A | * | 2/1999 | Ferraiolo et al. | 714/700 |
| 5,914,631 A | * | 6/1999 | Soneda | 327/535 |
| 6,259,294 B1 | * | 7/2001 | Murakami et al. | 327/277 |
| 6,285,229 B1 | * | 9/2001 | Chu et al. | 327/277 |
| 6,975,682 B2 | * | 12/2005 | Cosand | 375/247 |
| 7,116,142 B2 | * | 10/2006 | Ferraiolo et al. | 327/149 |
| 7,486,126 B2 | * | 2/2009 | Shimazaki | 327/295 |
| 7,532,029 B1 | * | 5/2009 | Asaduzzaman et al. | 326/38 |
| 7,853,844 B2 | * | 12/2010 | Sasagawa | 714/724 |
| 2007/0008793 A1 | * | 1/2007 | Hirobe | 365/194 |
| 2007/0124532 A1 | * | 5/2007 | Bennett | 711/100 |
| 2007/0255992 A1 | * | 11/2007 | Sasagawa | 714/736 |

OTHER PUBLICATIONS

A. Sathanur et al, "Physically Clustered Forward Body Biasing for Variability Compensation in Nanometer CMOS design" DATE09, 2009 6 pages.

* cited by examiner

*Primary Examiner* — Sun Lin
(74) *Attorney, Agent, or Firm* — Nixon & Vanderhye P.C.

(57) ABSTRACT

An integrated circuit includes processing circuitry that includes a plurality of critical path circuits. These critical path circuits include variable delay circuits which add an additional delay in to a path delay through each of the critical path circuits so as to adjust the path delay to match a target path delay. Variable delay circuit includes a tank capacitor which is charged or discharged to generate a control voltage. This control voltage serves to control a power supply voltage fed to an inverter chain. Variation in the power supply voltage of the inverter chain adjust the propagation speed of a processing signal through the inverter chain and accordingly adjusts the additional delay imposed by the variable delay circuit.

12 Claims, 11 Drawing Sheets

$\Delta V = V_{Out1} - V_{Out2} = k_1 \Delta t (\text{Probe OUT, Reference signal})$ $V_{Out3} = k_2(V_{Out1} - V_{Out2}) = k_2 k_1 \Delta t(\text{Probe OUT, Reference signal})$ if $V_{Out1} \geq V_{Out2}$
$V_{Out3} = 0$ if $V_{Out1} < V_{Out2}$ $V_{Out4} = k_2(V_{Out2} - V_{Out1}) = k_2 k_1 \Delta t(\text{Probe OUT, Reference signal})$ if $V_{Out2} \geq V_{Out1}$
$V_{Out4} = 0$ if $V_{Out2} < V_{Out1}$ $I_3 = f(V_{Out3}) = k_{34} V_{Out3}$ (can be not linear)
$I_4 = f(V_{Out4}) = k_{34} V_{Out4}$ (can be not linear)
$V_{Out5} = V_{dd} - (I_3/C_{34})T_{Spl} = V_{dd} - (k_{34}k_2k_1 \Delta t(\text{Probe OUT, Reference signal})T_{Spl}/C_{34})$
$= N - M \Delta t(\text{Probe OUT, Reference signal}) T_{Spl}$
$V_{Out6} = V_{dd} - (I_4/C_{34})T_{Spl} = V_{dd} - (k_{34}k_2k_1 \Delta t(\text{Reference signal, Probe OUT})T_{Spl}/C_{34})$
$= N - M \Delta t(\text{Reference signal, Probe OUT}) T_{Spl}$

INTEGRATED CIRCUIT WITH TIMING ADJUSTMENT MECHANISM

This application claims priority to US Provisional Application No. 61/350,138, filed Jun. 1, 2010, the entire content of which is hereby incorporated by reference.

BACKGROUND OF THE INVENTION

1. Field of the Invention

This invention relates to the field of integrated circuits. More particularly, this invention relates to the timing constraints associated with signals propagating through an integrated circuit.

2. Description of the Prior Art

It is known within integrated circuits that certain portions of the integrated circuit represent critical paths for processing signals. Such critical paths may, for example, represent processing bottlenecks which restrict the maximum processing speed which can be achieved if they operate too slowly, or may be paths, such as timing paths used within self-timed circuits, which will cause incorrect operation if they operate too quickly. Existing circuit design and synthesis tools are able to identify such critical paths and simulate their operation to determine their typical, lowest and highest path delay when the integrated circuit is manufactured.

It will be appreciated that variations in the manufacture of integrated circuits produces variations in path delay through critical paths. Thus, while an integrated circuit may be designed such that the critical paths have a typical path delay which will produce correct operation, the variations produced in manufacturing may mean that some of these critical paths operate either too quickly or too slowly and the integrated circuit concerned will not function correctly. This reduces the yield of correctly operating integrated circuits produced by the manufacturing process. These problems are becoming greater as process geometry sizes are reducing since the degree of variation due to manufacturing increases at smaller process geometry sizes. There is a further problem that the ageing of integrated circuits can change path delays and take these outside an acceptable range causing the integrated to fail when in use.

SUMMARY OF THE INVENTION

Viewed from one aspect the present invention provides an integrated circuit comprising:

processing circuitry including a plurality of critical path circuits, each of said plurality of critical path circuits performing part of functional data processing operations of said integrated circuit and having a path delay corresponding to a time for a processing signal to propagate therethrough; and path control circuitry coupled to said plurality of critical path circuits and configured to detect a path delay through each of said plurality of critical path circuits;

wherein each of said plurality of critical path circuits includes variable delay circuitry configured to increase a path delay through said critical path circuit by an additional delay amount controlled by said path control circuitry; and said path control circuitry is configured to control said variable delay circuitry to increase said path delay to match a target path delay.

The present technique provides an approach in which the critical path circuits are designed to have a path delay which is lower than actually required. The variable delay circuitry within each critical path may then be used to slow the propagation of the processing signal through that critical path by an additional delay amount such that the resulting path delay will match a target path delay. The amount of additional delay introduced by the variable delay circuitry may be adjusted to take account of the variation between individual integrated circuits that arises due to manufacturing variability and/or ageing of the integrated circuits. In the case of critical paths subject to a maximum path delay, the introduction of the variable delay circuitry will serve to increase the path delay and accordingly constrain the maximum performance which can be achieved for the integrated circuit. However, the advantage of the variable delay circuitry is that it reduces the variation in path delay that is present between individual integrated circuits and increases the manufacturing yield even though the integrated circuits concerned may have a lower maximum performance. In the case of critical paths which have a minimum path delay requirement, then the variable delay circuitry is able to provide such a minimum path delay accurately for each individual integrated circuit overcoming the manufacturing variation between individual integrated circuits and/or the ageing effects which can alter path delays over time and take a path delay outside an acceptable range. The critical paths will be designed to operate more rapidly than their target path delay and then the variable delay circuitry used to increase the path delay so as to match the target path delay with an improved degree of accuracy which increases the yield of correctly operating in the integrated circuits.

It will be appreciated that the variable delay circuitry can have a variety of different forms. One form of variable delay circuitry which is compact and effective is when the variable delay circuitry includes a tank capacitor and the path control circuitry is configured to control the charge stored in the tank capacitor so as to provide a control voltage level at one terminal of the tank capacitor. A portion of the variable delay circuitry is then provided with a power supply voltage dependent upon the control voltage level maintained by the tank capacitor. The power supply voltage provided to the portion of the variable delay circuitry controls the speed of that portion of the variable delay circuitry and accordingly controls the size of the additional delay amount introduced by the variable delay circuitry.

The portion of the variable delay circuitry which has its speed of operation controlled by the power supply voltage may conveniently comprise an inverter chain configured to propagate the processing signal. Such an inverter chain is relatively compact and yet shows an appropriate degree of variation in its speed of operation with the applied power supply voltage.

An efficient and effective way of controlling the amount of charge stored in the tank capacitor is via a regulated current line extending between the path control circuitry and the tank capacitor. Such a regulated current line may be used to either add charge to the tank capacitor or remove charge from the tank capacitor under control of the path control circuitry in dependence upon whether it is desired to either increase or decrease the control voltage provided by the tank capacitor.

While it is possible in some embodiments that the variable delay circuitry may be adequately controlled using a single control voltage provided by a single tank capacitor for that variable delay circuitry, in other embodiments it may be that more than one control voltage is desirable (e.g. different control voltages to respectively control the rising edge and the falling edge behaviour of the critical path). In these circumstances, the variable delay circuitry may comprise two tank capacitors each providing a control voltage level for separately controlling two power supply voltages for at least a portion of the variable delay circuitry.

While one possibility is to provide a separate regulated current line for each individual variable delay circuitry, the amount of overhead associated with the present technique may be reduced when a regulated current line is shared using time division multiplexing between a plurality of variable delay circuitry with each of these being coupled to the regulated current line via a respective transmission gate. Thus, within respective time slots of the time division multiplexing, each variable delay circuitry can have its additional delay amount adjusted using the regulated current line and when other variable delay circuitry is being adjusted may be isolated from the regulated current line using a transmission gate.

The robustness of the control of the variable delay circuitry may be improved by the provision of analog buffer circuitry configured to receive the control voltage as an input signal and to output a buffered signal which is then used to control the additional delay amount.

As the control voltage used to control operation of the variable delay circuitry will typically be less than a full rail voltage, this may not be well suited to controlling propagation of both rising and falling edges of the processing signal. Accordingly, in some embodiments the variable delay circuitry is configured to use the control voltage to control switching of a first transistor within an inverter to drive an output of the inverter corresponding to the processing signal when the processing signal has a first value and to use a power supply voltage to control switching of a second transistor within the inverter to drive the output of the inverter corresponding to the processing signal when the processing signal has a second value. Thus, the use of less than fall rail control voltages to control the switching of inventor may be avoided in circumstances where it is not desired.

Viewed from another aspect the present invention provides an integrated circuit comprising:

processing means for processing data, said processing means including a plurality of critical path means for performing part of functional data processing operations of said integrated circuit and each of said critical path means having a path delay corresponding to a time for a processing signal to propagate therethrough; and path control means for detecting a path delay through each of said plurality of critical path means;

wherein each of said plurality of critical path means includes variable delay means for increasing a path delay through said critical path means by an additional delay amount controlled by said path control means; and said path control means is configured to control said variable delay means to increase said path delay to match a target path delay.

Viewed from a further aspect the present invention provides a method of operating an integrated circuit comprising the steps of:

processing data with processing circuitry, said processing circuitry including a plurality of critical path circuits configured to perform part of functional data processing operations of said integrated circuit, each of said critical path circuits having a path delay corresponding to a time for a processing signal to propagate therethrough;

detecting a path delay through each of said plurality of critical path circuits; and in response to said detected delay, increasing a path delay through said critical path circuit by an additional delay amount using a variable delay circuit within said critical path circuit so that said path delay matches a target path delay.

The above, and other objects, features and advantages of this invention will be apparent from the following detailed description of illustrative embodiments which is to be read in connection with the accompanying drawings.

DESCRIPTION OF THE EMBODIMENTS

Figure 1:
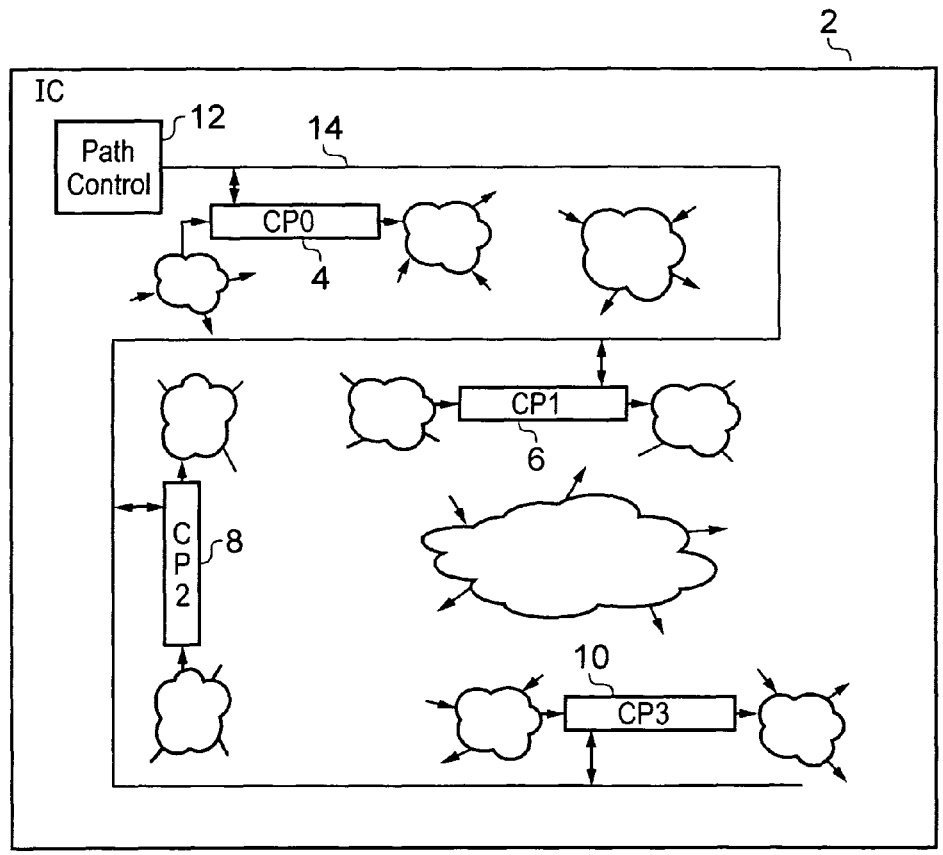
FIG. 1 schematically illustrates an integrated circuit including a plurality of critical path circuits controlled by path control circuitry.

FIG. 1 schematically illustrates an integrated circuit 2 including processing circuitry for performing processing operations. This processing circuitry includes critical path circuits 4, 6, 8, 10 which each perform part of functional data processing operations of the integrated circuit. The critical path circuits 4, 6, 8, 10 may, for example, be timing paths used to generate self-timing signals within a memory circuit. Many other different forms of critical path circuit are also possible and the present techniques may be used with these different forms of critical path circuit.

Path control circuitry 12 is coupled via a regulated current line 14 to each of the critical path circuits 4, 6, 8, 10. This regulated current line 14 is used to adjust an additional time delay that is part of the path delay of each of the critical path circuits 4, 6, 8, 10 and is provided by variable delay circuitry disposed within those critical path circuits 4, 6, 8, 10. Individual regulated current lines may be provided for each of the critical path circuits 4, 6, 8, 10, or alternatively a current regulated line 14 may be shared between multiple critical path circuits 4, 6, 8, 10 using time division multiplexing and transmission gates which selectively couple the relevant critical path circuit 4, 6, 8, 10 to the current regulated line 14 at a predetermined time slot within the time division multiplexer.

Figure 2:
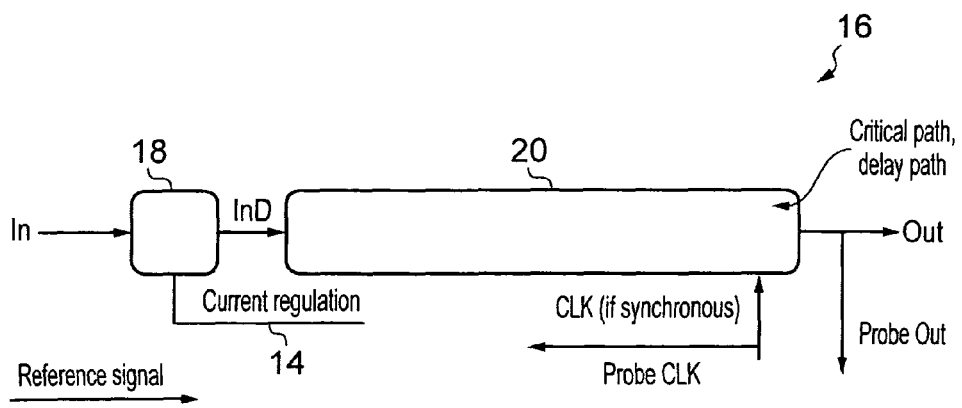
FIG. 2 schematically illustrates variable delay circuitry that is included within critical path circuitry to add an additional delay amount.

FIG. 2 schematically illustrates a critical path circuit 16 including a variable delay circuit 18. A processing signal In is input to the variable delay circuit 18 and propagates therethrough before subsequently propagating through the main body 20 of the critical path circuitry and emerging as an output signal Out from the critical path circuit 16. The total delay through the critical path circuitry 16 is the path delay and comprises the variable additional delay imposed by the variable delay circuitry 18 added to the delay through the main body 20. The delay through the main body 20 may be subject to considerable variation due to manufacturing tolerances. Accordingly, the amount of additional delay added by the variable delay circuitry 18 can be varied under control of the current regulated line 14 such that the total path delay through the critical path circuitry 16 matches a target path delay with a relatively close tolerance.

The present techniques can be used with both synchronous and asynchronous critical path circuits. The path delay can be measured by the path control circuitry 12 using a probe output signal fed back to the path control circuitry and compared with either a reference signal or a reference clock signal depending upon whether the critical path circuit 16 concerned is synchronous or asynchronous.

The critical paths (sensitive paths) within the integrated circuit 2 may be identified during the design of the integrated circuit 2 by the automated design tools and/or automated synthesis tools. Once identified, these critical paths may be modified by the addition of variable delay circuitry 18 either automatically inserted by the tools or manually inserted by a designer when the tools have identified the critical paths. The number of critical path circuits which are subject to the adjustment in accordance with the present techniques can be selected depending upon the target yield for the manufacturing process. The greater the number of critical paths which are subject to the present adjustment techniques, the higher the likelihood that the integrated circuits will operate correctly even when subject to high degrees of manufacturing variation and accordingly the yield will be increased. However, it will be appreciated that there is a circuit area and control overhead associated with the introduction of the variable delay circuits and accordingly a balance should be struck between being able to adjust critical paths to match the target path delay weighed against the overhead added.

Figure 3:
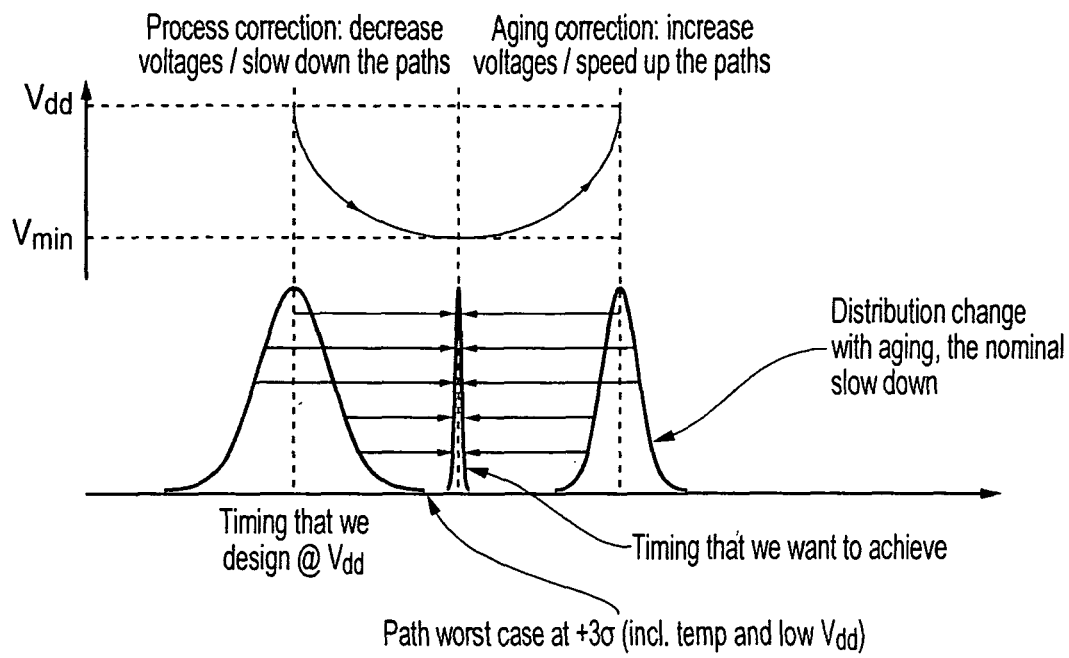
FIG. 3 schematically illustrates variation in path timing for integrated circuits as manufactured, as subjected to timing control in accordance with an example of the present techniques, and as aged.

FIG. 3 schematically illustrates the variation of critical path delay across a population of integrated circuits. The distribution path delays across a population of integrated circuits as predicted at design given a known degree of manufacturing variation is as shown in the left hand population. The design path delay is less than the target path delay that is desired in operation. This allows for the addition of variable delay circuitry which will increase the path delays, but will reduce the variation in path delay such that there is a relatively tight tolerance around the target path delay as shown in the middle population of FIG. 3. The present techniques also permit the path delay to be maintained despite ageing effects within integrated circuits which typically tend to increase path delays. When ageing changes (increases) a path delay, the amount of additional delay being introduced by way of variable delay circuitry 18 can be changed (reduced) so as to maintain the path delay at the target path delay. Without such variation of the additional delay the distribution of delay, within an aged population of integrated circuits would typically drift to be as illustrated in the right hand population of FIG. 3.

Figure 4:
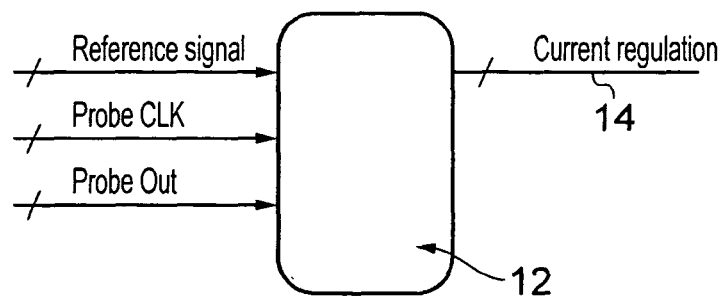
FIG. 4 schematically illustrates path control circuitry.

FIG. 4 schematically illustrates path control circuitry 12 at a high level. In this example, multiple current regulated lines 14 are illustrated and are supplied to individual variable delay circuitry 18. A reference signal, a probe clock signal and a probe output monitoring the actual behaviour of individual critical path circuitry 16 are supplied to the path control circuitry 12 and are used to set the signal on the current regulated line 14 as will be described further below.

Figure 5:
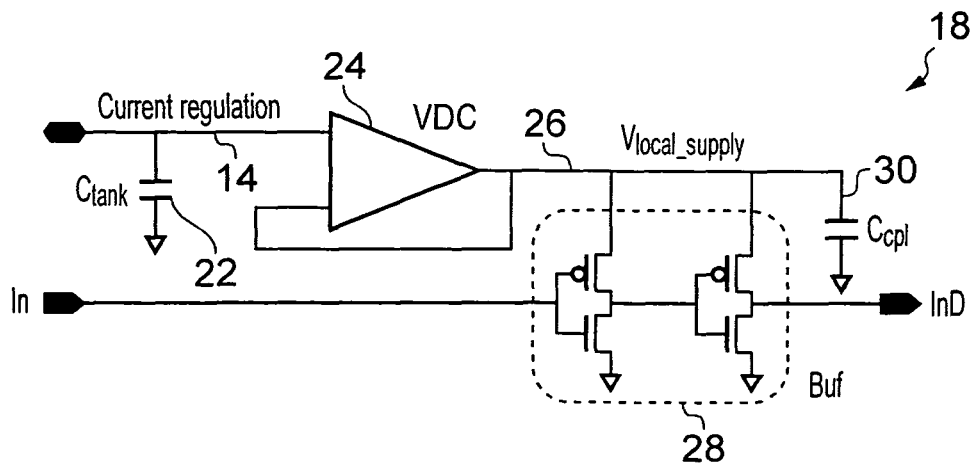
FIG. 5 schematically illustrates one example of variable delay circuitry.

FIG. 5 schematically illustrates one example of variable delay circuitry 18 in more detail. This variable delay circuitry 18 includes a tank capacitor 22 which is charged via the current regulated line 14 and has at one terminal thereof a control voltage determined by the amount of charge stored within the tank capacitor 22. This control voltage is supplied to a voltage down converter 24 and produces a local power supply voltage on power supply line 26 which is less than the nominal power supply rail voltage $V_{DD}$. This local power supply voltage is used to power an inverter chain 28 through which the processing signal In propagates. The speed of operation of the inverters within the inverter chain 28 is adjusted by the level of their local power supply and accordingly the magnitude of the additional delay introduced by the propagation of the processing signal in through the inverter chain 28 can be varied in dependence upon the local power supply level. This local power supply is in turn varied by the control voltage level, which is itself controlled by the amount of charge stored within the tank capacitor 22. A local decoupling capacitor 30 may be provided to stabilise the local power supply voltage against high speed transients.

The size of the variable delay circuitry 18 can be kept small by keeping the circuitry simple and using design reference manual minimum size devices. Variation within the variable delay circuitry 18 may be compensated for by the variable additional delay imposed by the variable of delay circuitry 18.

If the inverter chain 28 (buffer) includes an even number of inverters, then both rising edge and falling edge transitions can be managed and the entire cycle of a processing signal delayed as appropriate. If the inverter chain 28 were, for example, to include n inverters, then it would be possible to vary the local supply voltage to all n inverters. However, the degree of sensitivity of the variation of the additional delay to the local supply voltage level may be too high with such an arrangement and accordingly it may be preferable to only vary the local supply voltage of a subset of the inverters within the inverter chain 28. As an example, if the inverter chain 28 were to contain ten inverters then it might be appropriate to vary the local power supply voltage of two of those inverters and this would give enough variation in the additional delay to compensate for typical variability in sub-32 nn process geometry size integrated circuits.

Figure 6:
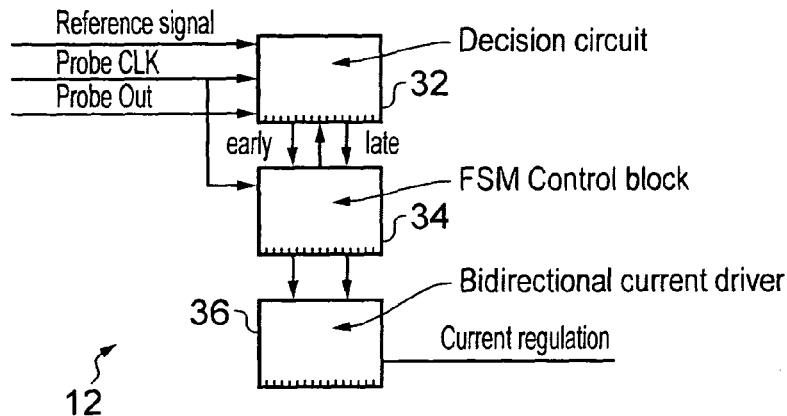
FIG. 6 schematically illustrates path control circuitry broken down into a number of functional blocks.

FIG. 6 schematically illustrates, at a functional block level, the components which may comprise the path control circuitry 12. More particularly, the path control circuitry 12 may be formed of decision circuitry 32, a finite state machine control block 34 and a bidirectional current driver 36.

Figure 7:
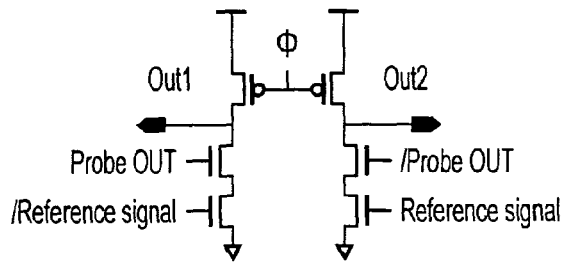
FIGS. 7, 8 and 9 schematically illustrate circuitry that can form a decision circuit within path control circuitry.
Figure 8:
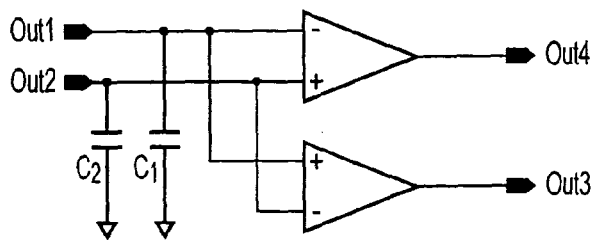
Figure 9:
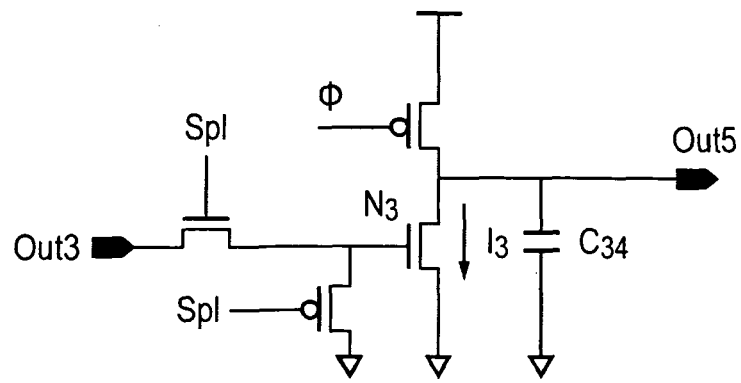
Figure 9:
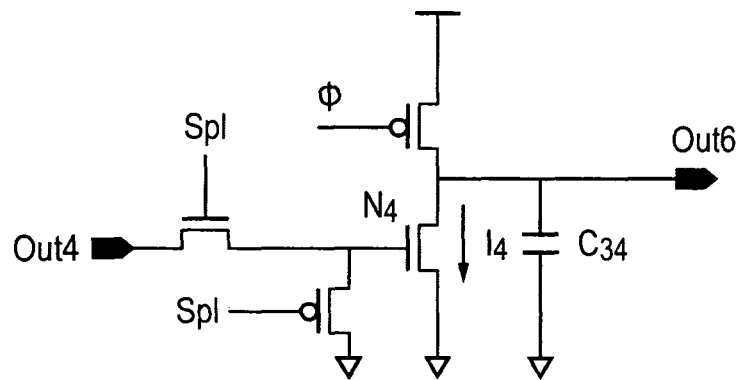
Figure 9:
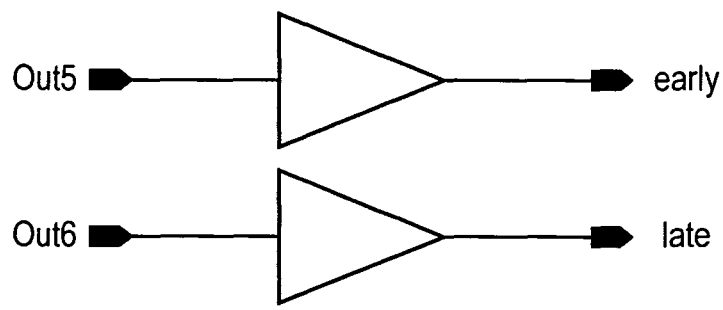

FIGS. 7, 8 and 9 schematically illustrate circuits which together can be used to form the decision circuit 32. The reference signal may come from outside the integrated circuit, such as from an off-chip phase lock loop, or inside the integrated circuit from an analog circuit providing an accurate reference signal. The monitored signal is the probe output signal. The relationship between the various voltages and currents provided by the circuitry of FIGS. 7, 8 and 9 is illustrated by the equations shown in these figures. The time difference included in these equations is derived from a time difference between the probe out signal and the reference signal. The probe out and reference signal drive an input interface based upon a dynamic logic approach to allow a fast response time and a low impedance so as to reduce the impact of the interface itself on delayed differences. Complementary signals illustrated as inputs to these circuits may be generated with dynamic inverters or classical inverters with body biases so as to reduce the amount of disturbance in the timing of these signals. The output of the decision circuit 32 is either an early signal or a late signal indicating whether or not the probe output signal indicates that the path delay is too low or too high.

Figure 10:
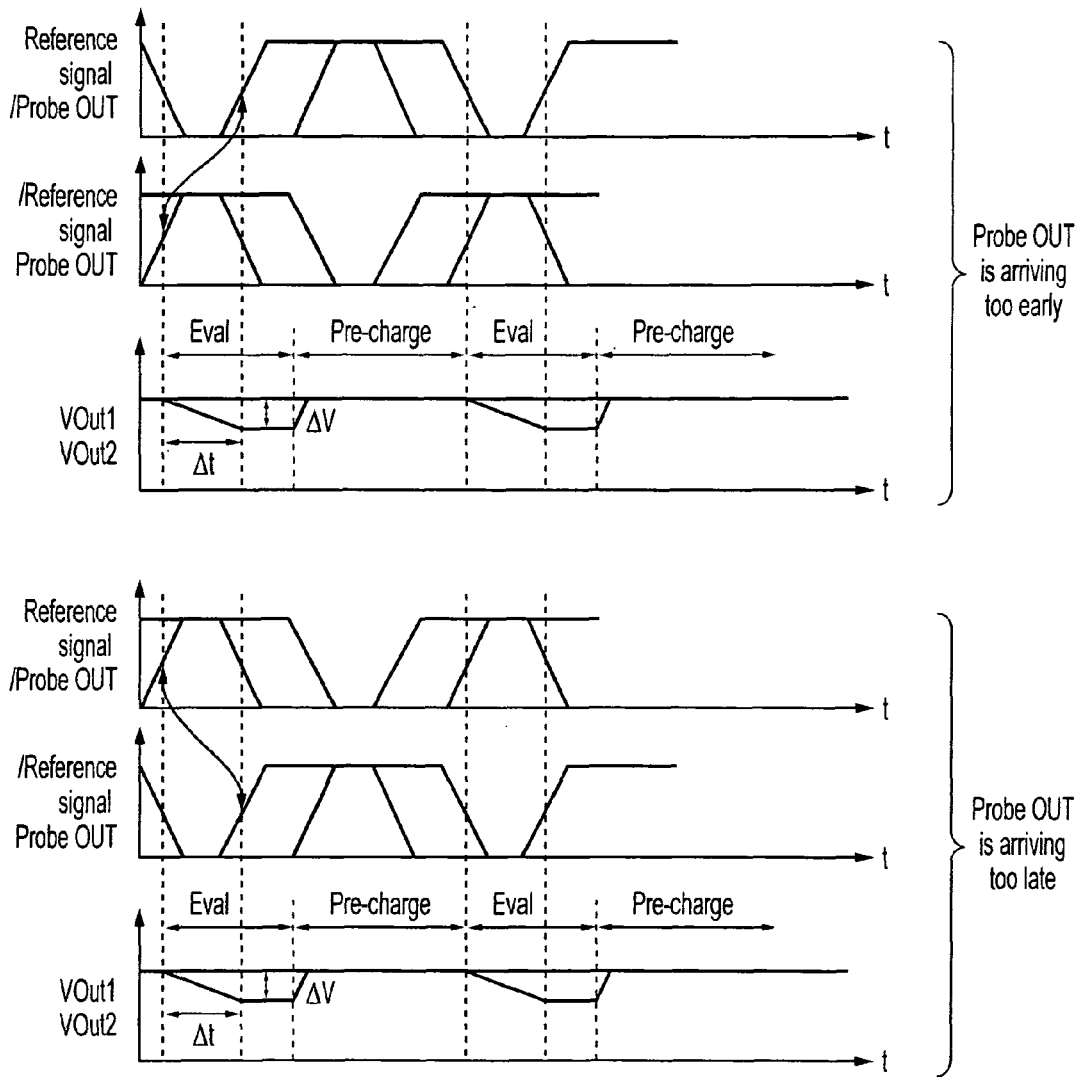
FIGS. 10 and 11 schematically illustrates the behaviour of the circuitry illustrated in FIGS. 7, 8 and 9.

FIG. 10 schematically illustrates timing differences between the reference signal and the probe output signal in the case of the probe output signal arriving either too early or too late. The corresponding Out1 and Out2 signals are illustrated as generated by the circuit of FIG. 7.

The DC levels of the signals from the circuitry of FIG. 7 are sampled in to the capacitors $C_1$ and $C_2$ of FIG. 8. The differences for both directions (early and late checks) are then amplified by two operational amplifiers as illustrated in FIG. 8 to drive the following stage of FIG. 9. The outputs of FIG. 9 (Out5 and Out6) are precharged to $V_{DD}$. Once the Out3 and Out4 voltages are available (after the evaluation and amplification phase) they are sampled for a sample time period (controlled by $T_{spl}$) and converted in to currents by the transistors $N_3$ and $N_4$. These currents linearly discharge the capacitors $C_3$ and $C_4$ with the discharge speed depending upon the input voltages. In this way, the final DC voltage levels depend upon the sampling time. As a small difference in delay will give a small input voltage and so a slow discharge, an increase in the sampling time will allow the system to sense such small differences in delay. The final signal processing illustrated in FIG. 9 shows two buffers acting as 1-bit and analogic-to-digital converters with a threshold usually set at $V_{DD}/2$, but this can be tuned with the transistor sizing. These transistors are made large enough to keep their threshold voltages roughly constant despite manufacturing variations.

Figure 11:
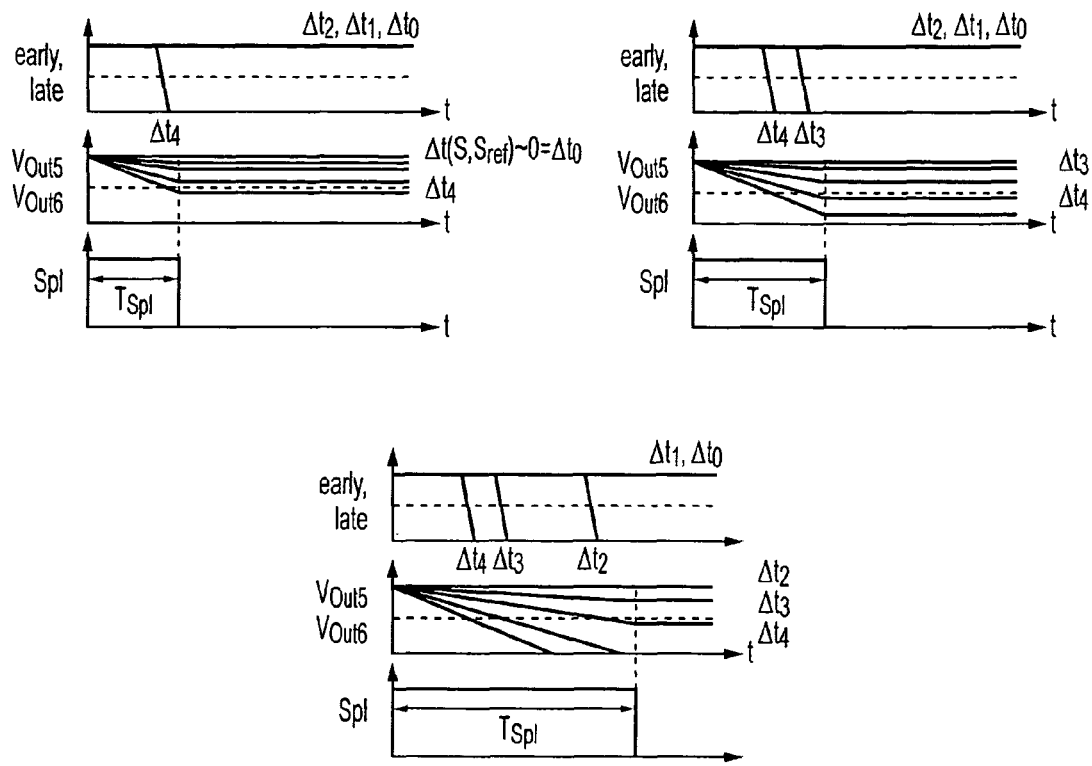

FIG. 11 schematically illustrates the signal levels achieved during operation of the circuitry of FIG. 9. Once the timing difference is detected (an accuracy of a picoseconds in timing can be achieved using appropriate sampling time), the early or late signal goes low while the other of these signals stays high. These signals are received by the finite state machine control block 34 which detects the falling transition of one of the two signals and adjusts the timing in the correct direction by appropriately driving the bidirectional current driver 36. The finite state machine control block 34 may be a purely digital circuit. If a falling transition occurs on the early signal, then a short pulse to enable the current driver may be generated in a way that serves to discharge the variable delay circuit tank capacitor 22. This in turn reduces the control voltage output from the tank capacitor 22 and slows down the signal propagation through the variable delay circuit. Conversely, if a fall occurs in the late signal, then the finite state machine control block 34 may generate a short pulse to enable the current driver so as to charge the tank capacitor 22 within the variable delay circuit thereby increasing the control voltage and speeding up the propagation through the variable delay circuit. If neither an early or late falling edge is detected then the path concerned is compensated and is accurately tuned to the target path delay.

It will be appreciated that the present techniques incur an overhead in terms of additional processing delay and power consumption, but these are compensated for by the reduced variation in the path delays and accordingly the higher manufacturing yields which may be achieved. The finite state machine control block 34 may embed counter circuitry to damp the control variations applied and/or to introduce some hysteresis in to the control applied so as to stabilise the behaviour of the calibration process.

Figure 12:
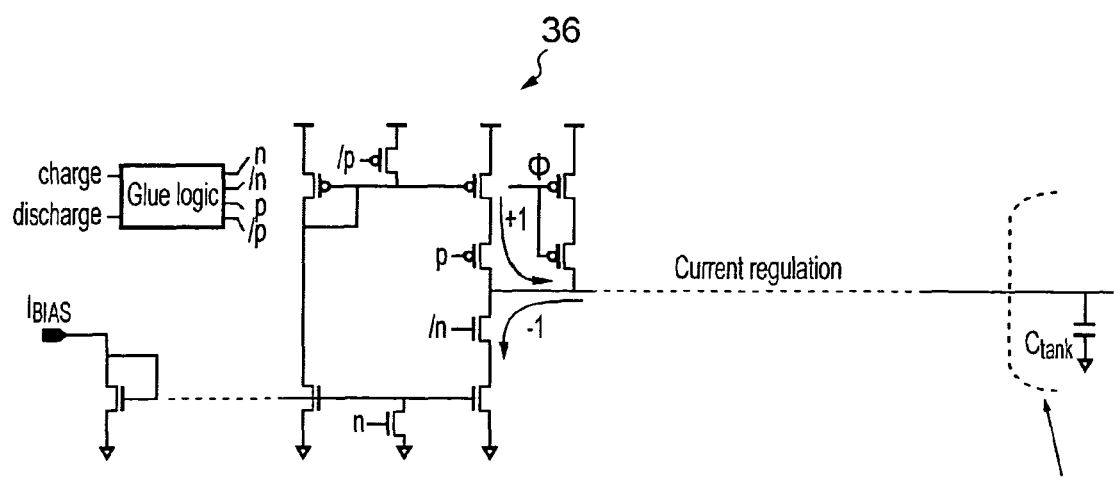
FIG. 12 schematically illustrates circuitry which can serve as a bi-directional current driver within path control circuitry.

FIG. 12 schematically illustrates a bidirectional current driver 36. The purpose of this bidirectional driver 36 is to charge or discharge the tank capacitor 22 within the variable delay circuit 18. The timing pulses from the finite state machine control block 34 command either a charge or a discharge of the tank capacitor 22. The glue logic illustrated generates corresponding p and n signals which switch the transistors illustrated so as to produce either linear charging of the tank capacitor 22 via a PMOS current mirror based constant current source or linear discharging of the tank capacitor 22 by a NMOS current mirror based constant current source. The tank capacitor 22 is precharged to a Vdd level during an initialisation phase of the integrated circuit 2, and subsequently the regulation process will be used during at least a boot phase of the integrated circuit so as to decrease the local voltage within the variable delay circuitry 18 and accordingly adjust the additional delay amount introduced to the critical path circuit.

Once the final compensated state has been reached, the finite state machine control block 34 may put the driver circuitry of FIG. 12 in to a high impedance state isolating the tank capacitor 22. The PMOS stack may be switched with $V_{DD}$ and the NMOS stacks switched with a ground voltage so as to minimise the leakage path of the tank capacitor through these paths within the driver circuitry. Periodic topping up of the tank capacitor 22 may be required in order to maintain appropriate control, but this may be relatively infrequent thereby saving power.

Other approaches to the provision of and control of the variable delay circuits are also possible. One example would be the use of discrete analog circuits using devices in series, such as diodes, NMOS resistors, etc, to generate discrete voltages (e.g. 10 my steps) instead of using the current driver and the local tank capacitor 22. In this case, large multiplexers would be required in each path to select the required local supply voltage level to be used to control the inverter chain 28. Another approach may use a digital technique to add capacitors and/or resistors and/or inverters to the signal path through the variable delay circuit 18 so as to provide the additional delay. Such an approach may use fuses, path-gates and latches to program the path. This approach may use multiplexers and local shift registers to drain the bit-stream in order to program the path dynamically.

Figure 13:
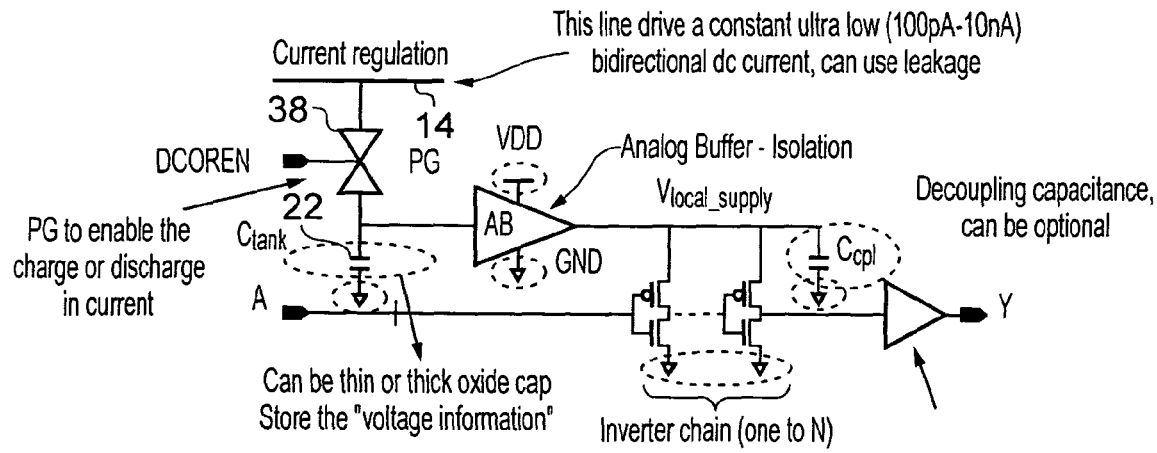
FIG. 13 schematically illustrate variable delay circuitry tuned for adjusting falling edge transitions.
Figure 14:
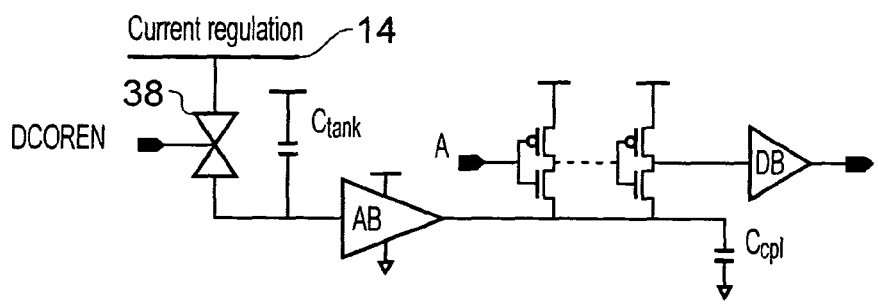
FIG. 14 schematically illustrates variable delay circuitry tuned for adjusting rising edge transitions.
Figure 15:
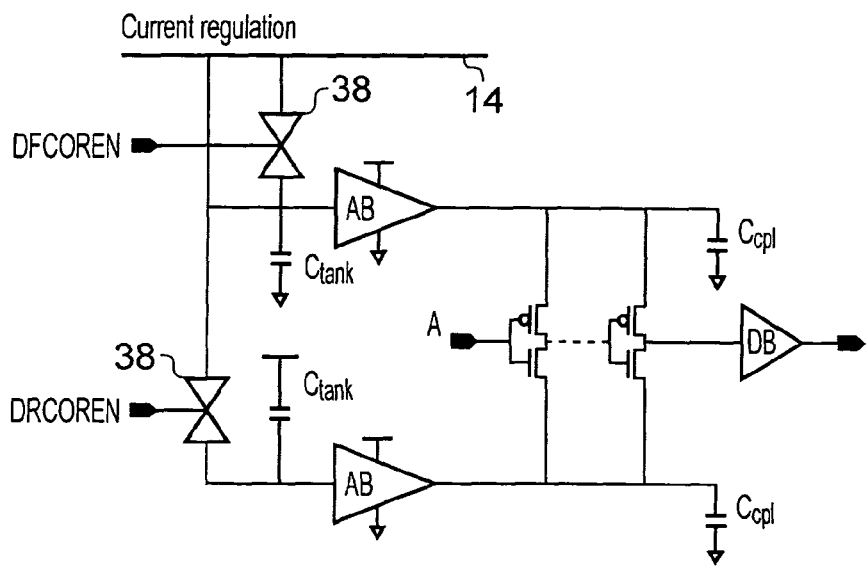
FIG. 15 schematically illustrates variable delay circuitry tuned for adjusting both falling edge and rising edge transitions.

FIGS. 13, 14 and 15 schematically illustrate variable delay circuits respectively tuned to favour adjustment of falling edges, rising edges and both falling and rising edges. Compared to the circuitry of FIG. 5 it will be seen that the tank capacitor in these examples is connected to the current regulation line 14 by a transmission gate 38. The use of such transmission gates permits the current regulation line 14 to be shared between multiple variable delay circuits using time division multiplexing. When the transmission gate 38 is open for a particular variable delay circuit 18, the current on the current regulation line 14 either discharges or charges the connected tank capacitor 22. When the transmission gate 38 is closed, then the tank capacitor 22 is isolated.

The embodiment of FIG. 13 varies the high potential power supply rail so as to adjust the additional delay. In contrast, the embodiment of FIG. 14 adjusts the level of the low potential power supply. The embodiment of FIG. 15 adjusts both the high potential and the low potential power supply voltage supplied to the inverter chain 28. In this way, the performance of the inverter chain in propagating falling edges, rising edges and both falling and rising edges may be modulated.

Figure 16:
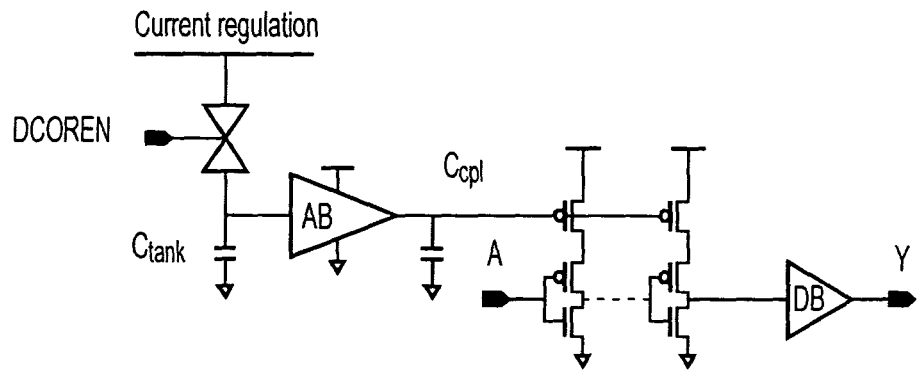
FIG. 16 schematically illustrates variable delay circuitry tuned for adjusting falling edge transitions and using pullup/pulldown gates.
Figure 17:
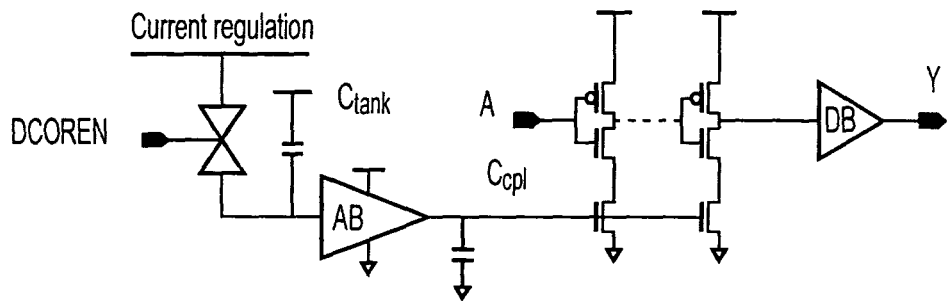
FIG. 17 schematically illustrates variable delay circuitry tuned for adjusting rising edge transitions and using pullup/pulldown gates.
Figure 18:
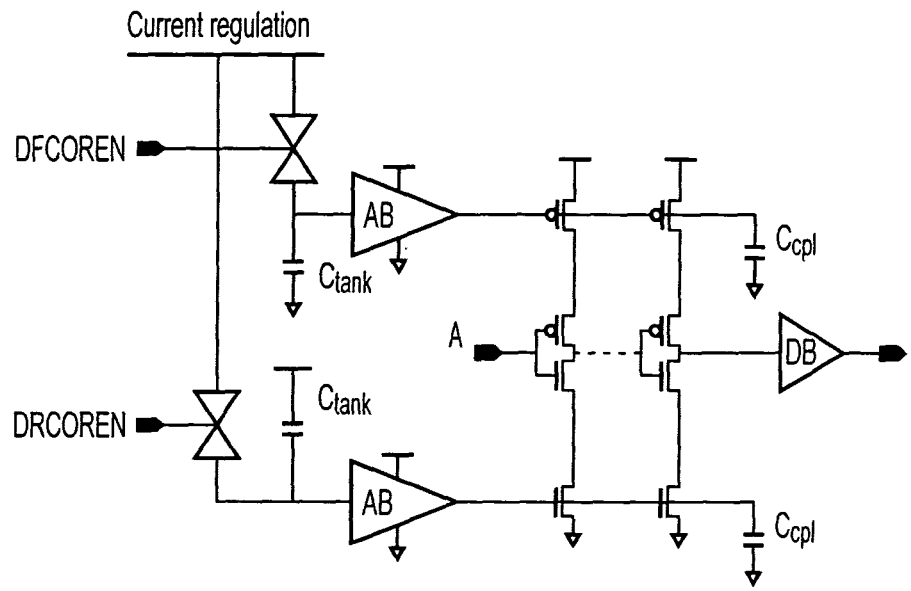
FIG. 18 schematically illustrates variable delay circuitry tuned for adjusting both falling and rising edge transitions and using pullup/pulldown gates.

FIGS. 16, 17 and 18 illustrate variations of the circuits of FIGS. 13, 14 and 15. In these variations the inverter chain 28 is connected to the power supplies via pull up or pull down gates which are themselves controlled by the output from the analog buffer.

Figure 19:
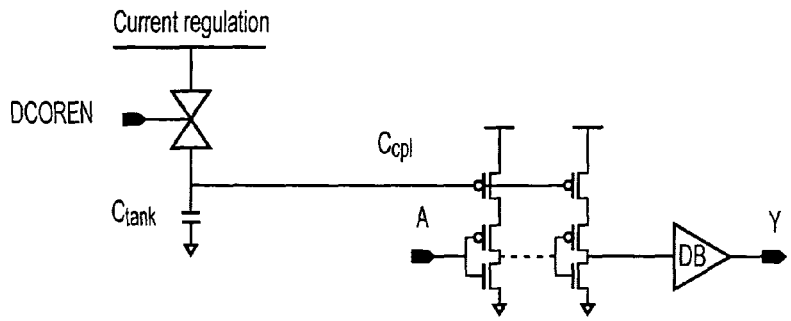
FIGS. 19, 20 and 21 are variations of the circuits of FIGS. 16, 17 and 18 not including an analog buffer circuit.
Figure 20:
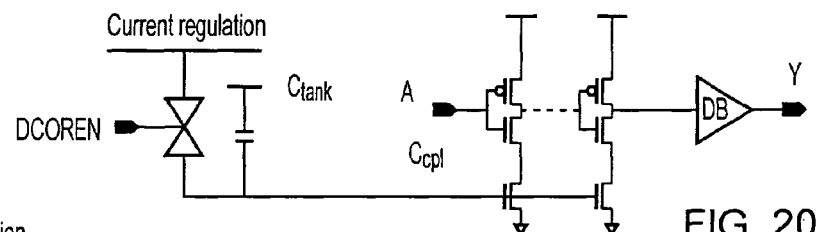
Figure 21:
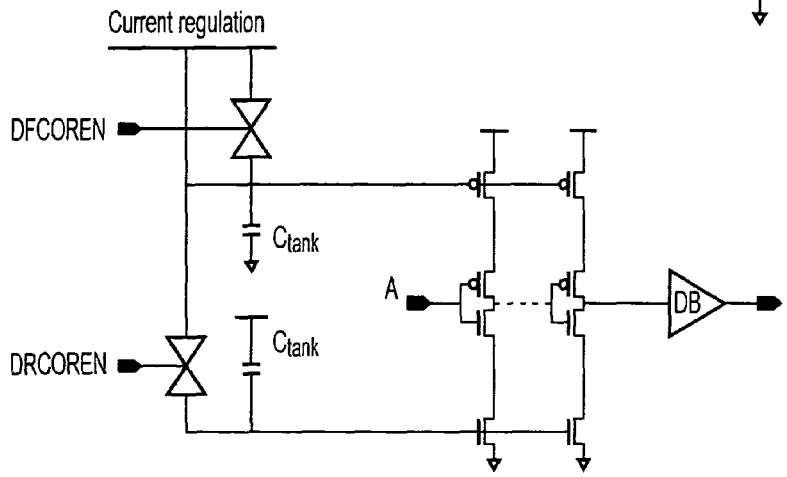

FIGS. 19, 20 and 21 schematically illustrate variations of the circuits of FIGS. 16, 17 and 18, but in this case without use of the analog buffer circuitry.

Figure 22:
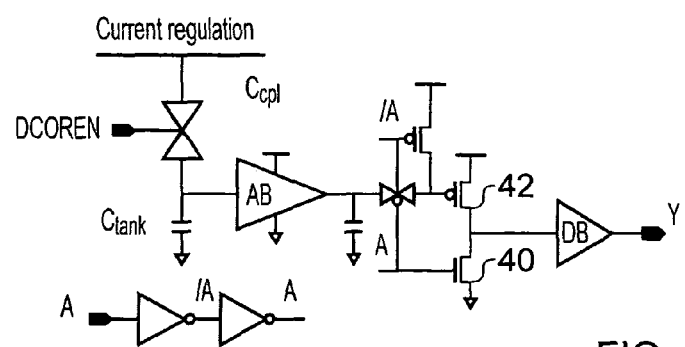
FIG. 22 schematically illustrates a variable delay circuit tuned for adjusting falling edge transitions and utilizing differential input signal modulation.

FIG. 22 schematically illustrates a variable delay circuit tuned for adjusting falling edge transitions based upon differential input selection modulation. When the input signal A is low the transistor 42 is switched on by the control voltage passed from the analog buffer via the transmission gate and the output is driven high. When the input A is high, then the transistor 40 is switched on and the output is driven low.

Figure 23:
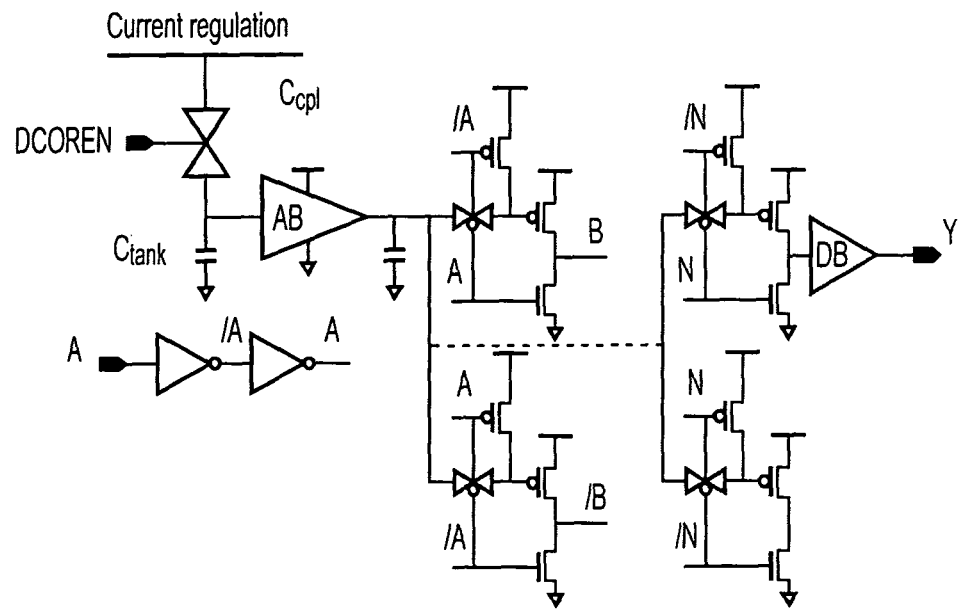
FIG. 23 schematically illustrates a variable delay circuit tuned for adjusting falling edge transitions and utilizing both differential input signal modulation and multiple stages.

FIG. 23 schematically illustrates a variation of the circuit of FIG. 22 but in this case tuned for adjusting both falling edge transitions and rising edge transitions.

Figure 24:
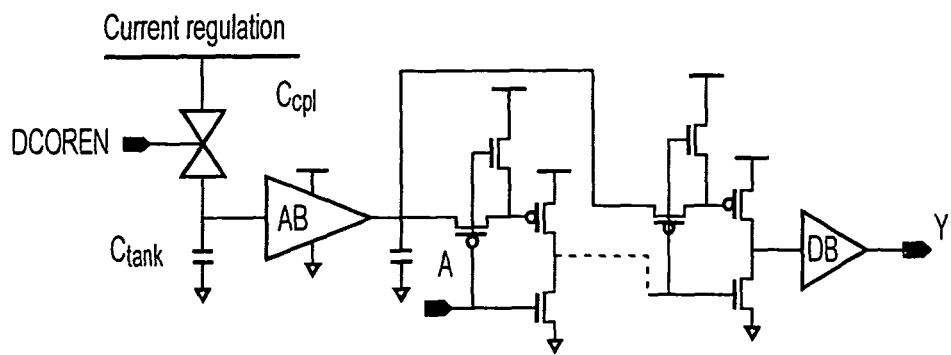
FIG. 24 schematically illustrates variable delay circuitry tuned for adjusting falling edge transitions using single-ended input signal modulation.

FIG. 24 illustrates an example of a variable delay circuit tuned for adjusting falling edge transitions and based upon single-ended input signal modulation using PMOS transistors in place of the transmission gates of FIGS. 22 and 23.

Figure 25:
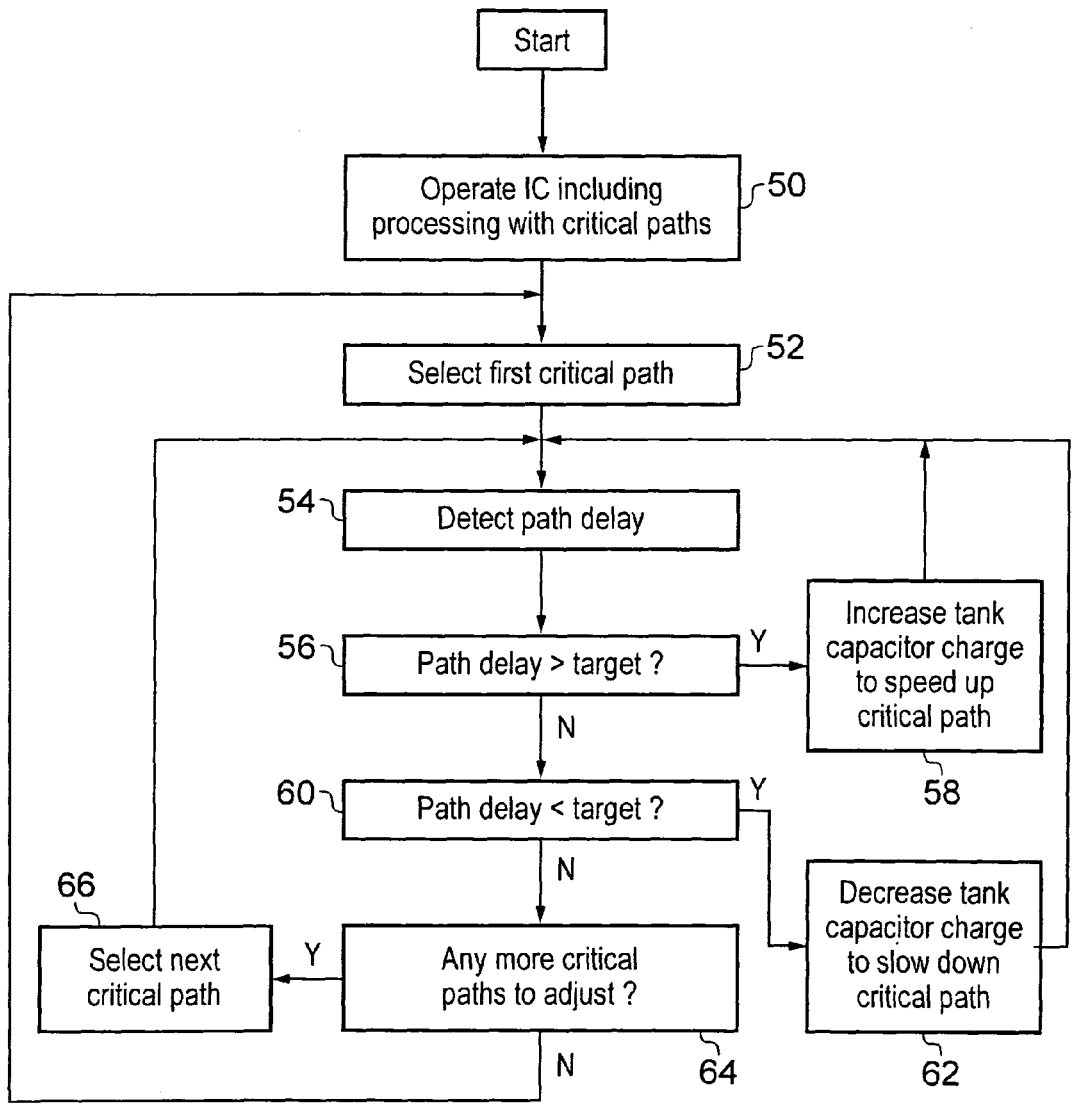
FIG. 25 is a flow diagram schematically illustrating the control of path delay in accordance with one example of the present techniques.

FIG. 25 is a flow diagram schematically illustrating the operation of one example of the present techniques. At step 50, the integrated circuit is operated to perform functional processing using the critical path circuits which incorporate the variable delay elements. At step 52, the first critical path is selected for adjustment. At step 54, a path delay through the selected critical path is determined. At step 56, a determination is made as to whether or not the detected path delay exceeds a target path delay. If the detected path delay exceeds a target path delay, then processing proceeds to step 58 where there is an increase in the tank capacitor charge which serves to speed up the critical path circuit and accordingly reduce the path delay. Processing then returns to step 54.

If the determination at step 56 is that the path delay does not exceed the target path delay, then processing passes to step 60 where a determination is made as to whether or not the path delay is less than a target path delay. If the path delay is less than the target path delay, then processing proceeds to step 62 where the tank capacitor charge is decreased so as to slow down the propagation of the processing signal through the critical path before processing is again returned to step 54.

If the determination at step 60 is that the path delay is not less than the target path delay, then processing proceeds to step 64 where a determination is made as to whether or not there are any more critical paths needing adjustment within the plurality of critical paths. If there are further critical paths needing adjustment in the current sequence, then step 66 selects the next critical path to be adjusted and returns processing to step 54. If there are no more critical paths to adjust in the current sequence, then processing returns to step 52. A delay before recommencing adjustment may be included prior to step 52.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. An integrated circuit comprising:
   a processing circuitry including a plurality of critical path circuits, each of said plurality of critical path circuits performing a part of functional data processing operations of said integrated circuit and having a path delay corresponding to a time for a processing signal to propagate therethrough; and
   a path control circuitry coupled to said plurality of critical path circuits and configured to detect a path delay through each critical path circuit of said plurality of critical path circuits;
   wherein said each critical path circuit includes a variable delay circuitry configured to increase a path delay through said critical path circuit by an additional delay amount controlled by said path control circuitry;
   said path control circuitry is configured to control said variable delay circuitry to increase said path delay to match a target path delay; and
   said variable delay circuitry includes a tank capacitor, said path control circuitry is configured to control charge stored in said tank capacitor to provide a control voltage level at one terminal of said tank capacitor, and a portion of said variable delay circuitry is provided with a power supply voltage dependent upon said control voltage level.

2. An integrated circuit as claimed in claim 1, wherein each of said plurality of critical path circuits is configured to have a typical path delay lower than said target path delay.

3. An integrated circuit as claimed in claim 1, wherein said portion of said variable delay circuitry comprises an inverter chain configured to propagate said processing signal.

4. An integrated circuit as claimed in claim 1, comprising a regulated current line extending between said path control circuitry and said tank capacitor and wherein said path control circuitry is configured to control charge stored in said tank capacitor via said regulated current line.

5. An integrated circuit as claimed in claim 4, wherein said regulated current line is shared using time division multiplexing between a plurality of variable delay circuitries each coupled to said regulated current line via a respective transmission gate.

6. An integrated circuitry as claimed in claim 1, wherein said path control circuitry is configured to add charge to said tank capacitor to increase said control voltage level and to remove charge from said tank capacitor to reduce said control voltage level.

7. An integrated circuit as claimed in claim 1, wherein said variable delay circuitry comprises two tank capacitors each providing a control voltage level for separately controlling two power supply voltages for at least a portion of said variable delay circuitry.

8. An integrated circuitry as claimed in claim 7, wherein said two power supply voltages respectively at least partially control a path delay for one of rising edges or falling edges of processing signals propagating through said variable delay circuitry.

9. An integrated circuit as claimed in claim 1, wherein said variable delay circuitry comprises an analog buffer circuitry configured to receive said control voltage as an input signal and to output a buffered signal to control said additional delay.

10. An integrated circuit as claimed in claim 1, wherein said variable delay circuitry is configured to use said control voltage to control switching of a first transistor within an inverter to drive an output of said inverter corresponding to said processing signal when said processing signal has a first value and to use a power supply voltage to control switching of a second transistor within said inverter to drive said output of said inverter corresponding to said processing signal when said processing signal has a second value.

11. An integrated circuit comprising:
   a processing means for processing data, said processing means including a plurality of critical path means for performing a part of functional data processing operations of said integrated circuit and each of said critical path means having a path delay corresponding to a time for a processing signal to propagate therethrough; and
   a path control means for detecting a path delay through each critical path means of said plurality of critical path means;
   wherein each of said plurality of critical path means includes a variable delay means for increasing a path delay through said each critical path means by an additional delay amount controlled by said path control means;
   said path control means is configured to control said variable delay means to increase said path delay to match a target path delay; and
   said variable delay means includes a tank capacitor means for storing charge, said path control means is configured to control charge, stored in said tank capacitor means to provide a control voltage level at one terminal of said tank capacitor means, and a portion of said variable delay means is provided with a power supply voltage dependent upon said control voltage level.

12. A method of operating an integrated circuit comprising steps of:
   processing data with processing circuitry, said processing circuitry including a plurality of critical path circuits configured to perform a part of functional data processing operations of said integrated circuit, each critical path circuit of said critical path circuits having a path delay corresponding to a time for a processing signal to propagate therethrough;
   detecting a path delay through said each critical path circuits; and
   in response to said detected path delay, increasing a path delay through said each critical path circuit by an additional delay amount using a variable delay circuit within said each critical path circuit so that said path delay matches a target path delay, said variable delay circuitry includes a tank capacitor,
   controlling charge stored in said tank capacitor to provide a control voltage level at one terminal of said tank capacitor; and
   providing a portion of said variable delay circuitry with a power supply voltage dependent upon said control voltage level.

* * * * *